US009354265B2

(12) United States Patent
Yamada et al.

(10) Patent No.: US 9,354,265 B2
(45) Date of Patent: May 31, 2016

(54) VEHICLE IDENTIFICATION SYSTEM AND METHOD

(71) Applicant: BOOZ-ALLEN & HAMILTON, McLean, VA (US)

(72) Inventors: Randy M. Yamada, Arlington, VA (US); David C. LeDoux, Reston, VA (US); Brandon M. Ayers, Falls Church, VA (US); Allan O. Steinhart, Vienna, VA (US)

(73) Assignee: BOOZ ALLEN HAMILTON INC., McLean, VA (US)

( * ) Notice: Subject to any disclaimer, the term of this patent is extended or adjusted under 35 U.S.C. 154(b) by 319 days.

(21) Appl. No.: 13/896,170

(22) Filed: May 16, 2013

(65) Prior Publication Data

US 2014/0340192 A1    Nov. 20, 2014

(51) Int. Cl.
  *G05B 1/01* (2006.01)
  *G01R 29/08* (2006.01)
  *G01R 31/00* (2006.01)

(52) U.S. Cl.
  CPC ........ *G01R 29/0814* (2013.01); *G01R 29/0878* (2013.01); *G01R 31/001* (2013.01); *G01R 31/007* (2013.01)

(58) Field of Classification Search
  CPC .. G01R 29/08; G01R 29/0878; G01R 31/001; G01R 31/007; G01R 29/0814
  See application file for complete search history.

(56) References Cited

U.S. PATENT DOCUMENTS

| | | | | |
|---|---|---|---|---|
| 5,282,134 | A * | 1/1994 | Gioutsos et al. | 701/45 |
| 8,577,631 | B2 * | 11/2013 | Kalokitis | G01R 19/145 702/65 |
| 2003/0167139 | A1 * | 9/2003 | Swartz et al. | 702/65 |
| 2009/0305665 | A1 * | 12/2009 | Kennedy et al. | 455/410 |
| 2011/0267222 | A1 * | 11/2011 | Craig | 342/25 B |
| 2012/0182643 | A1 * | 7/2012 | Zhang et al. | 360/77.02 |

OTHER PUBLICATIONS

Dong, Xiaopeng et al., "Detection and Identification of Vehicles Based on their Unintended Electromagnetic Emissions," vol. 48, No. 4, pp. 752-759, *IEEE Transactions on Electromagnetic Compatibility*. Nov. 2006.
Noble, I.E., "EMC and the Automotive Industry," pp. 264-271, *Electronics & Communication Engineering Journal*, Oct. 1988-1992.
Press, William H. et al., Numerical Recipes in C: The Art of Scientific Computing 2nd Ed. pp. 59-71 "2.6 Singular Value Decomposition," Cambridge University Press, 1992 (ISBN 0-521-43108-5).

* cited by examiner

*Primary Examiner* — Benjamin C Lee
*Assistant Examiner* — Rajsheed Black-Childress
(74) *Attorney, Agent, or Firm* — Buchanan Ingersoll & Rooney PC

(57) ABSTRACT

Exemplary systems and methods are directed to establishing a signature for a device emitting electromagnetic radiation (EMR). The system includes a radio frequency (RF) receiver, a signal processor, and a signature generator. The RF receiver samples detected EMR, generate pulses having characteristics that are a function of the EMR, and select generated pulses in a spectral band having energy above a predetermined threshold. The signal processor establishes a set of correlated pulses, computes a vector space associated with the set of correlated pulses, and compares each pulse in the set of correlated pulses to a basis of the vector space for establishing a device signature, and associates pulses having a threshold percentage of energy within the basis in a database with a device identifier.

29 Claims, 9 Drawing Sheets

VEHICLE IDENTIFICATION SYSTEM AND METHOD

FIELD

This disclosure relates to identifying a device based on characteristics of electromagnetic radiation emitted by the device.

BACKGROUND

Numerous devices of varying types and sizes are known to generate and emit electromagnetic radiation. Many of these devices have a unique combination of components and mechanical properties that distinguish their respective radio frequency (RF) emissions from those of another device. For example, considering devices such as vehicles, those of the same make and/or model are known to have varying electromagnetic emissions based on transients generated by the vehicle electrical system, the vehicle geometry, and signals produced by the vehicle's electronic components such as electronic systems that incorporate high-speed digital logic such as microprocessors and their associated components, and electronic chopper circuits used for lamp dimming or motor speed control.

US 2011/0267222 discloses a vehicle detection system and method used to identify, track, and locate a vehicle by passively sensing RF signals emitted by a target. The system includes an antenna and a processing module. The antenna scans select frequencies of known RF signatures. The processing module compares the scanned RF data to stored template signatures and determines a location of the target emitting the RF. Once the location of the target is determined, it is output to a display or transmitted to another electronic device.

SUMMARY

An exemplary system for establishing a signature for a device emitting electromagnetic radiation (EMR) is disclosed, comprising: a radio frequency (RF) receiver configured to sample detected EMR, generate pulses having characteristics that are a function of the EMR, and select pulses in a spectral band having energy above a predetermined threshold; a signal processor configured to establish a set of correlated pulses from among the selected pulses; and a signature generator configured to compute a vector space associated with the set of correlated pulses, compare each pulse in the set of correlated pulses to a basis of the vector space for establishing a device signature, and associate pulses having a threshold percentage of energy within the basis in a database with a device identifier.

An exemplary method for establishing a signature for a device emitting electromagnetic radiation (EMR) is disclosed, comprising: detecting EMR emitted from the device; sampling the EMR to generate pulses having characteristics that are a function of the EMR; selecting the generated pulses which have energy above a predetermined threshold as a set of correlated pulses; calculating a vector space based on the energy of each pulse in the set of correlated pulses; and establishing a signature of the EMR emitting device by comparing each pulse in the set of correlated pulses to a basis of the vector space, wherein each pulse in the signature has a threshold percentage of energy within an associated subspace of the vector space basis

DESCRIPTION OF THE DRAWINGS

In the following, the disclosure will be described in greater detail by way of exemplary embodiments and with reference to the attached drawings, in which.

DETAILED DESCRIPTION

Exemplary embodiments of the present disclosure are directed to an exemplary system, apparatus, and method that can passively identify a device based on the electromagnetic radiation (EMR) emitted by the device. Plural such devices can have varying differences in spectral or temporal radio frequency (RF) outputs because of each device's respective length in service or use, exchanged parts due to repairs, damage, wear, or other notable characteristics of a physical state, condition, or configuration of the device as observed. These differences can be used along with the spatial and temporal characteristics of the RF signatures to establish unique device signatures, and facilitate identification techniques based on the signatures. The devices can include any components, systems, or circuits having a capacity to emit measurable electromagnetic radiation. For example, according to exemplary embodiments of the present disclosure a device can encompass heavy machinery such as tractors, cranes, or bulldozers, transport vehicles such as airplanes, trains, automobiles, ships, boats, motorcycles, trucks, private or industrial machinery used in manufacturing or processing plants, or any other suitable device as appropriate.

Figure 1:
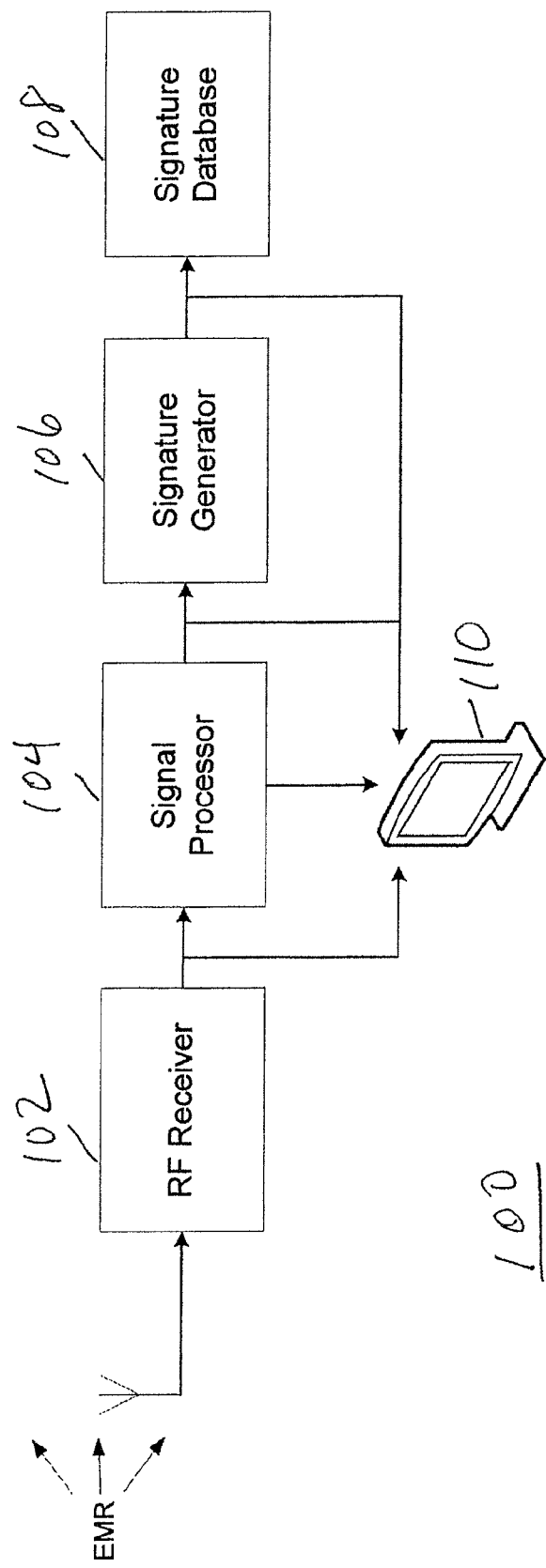
FIG. 1 illustrates a system for establishing a device signature in accordance with an exemplary embodiment of the present disclosure.

FIG. 1 illustrates a system 100 for establishing a device signature in accordance with an exemplary embodiment of the present disclosure. The system 100 is configured to establish a signature for a device emitting electromagnetic radiation (EMR). The system 100 includes a radio frequency (RF) receiver 102 configured to sample detected EMR, generate digital pulses having characteristics that are a function of the EMR, and select a number of the generated pulses within in a specified spectral band and having energy above a predetermined threshold $T_{SE}$.

Figure 2:
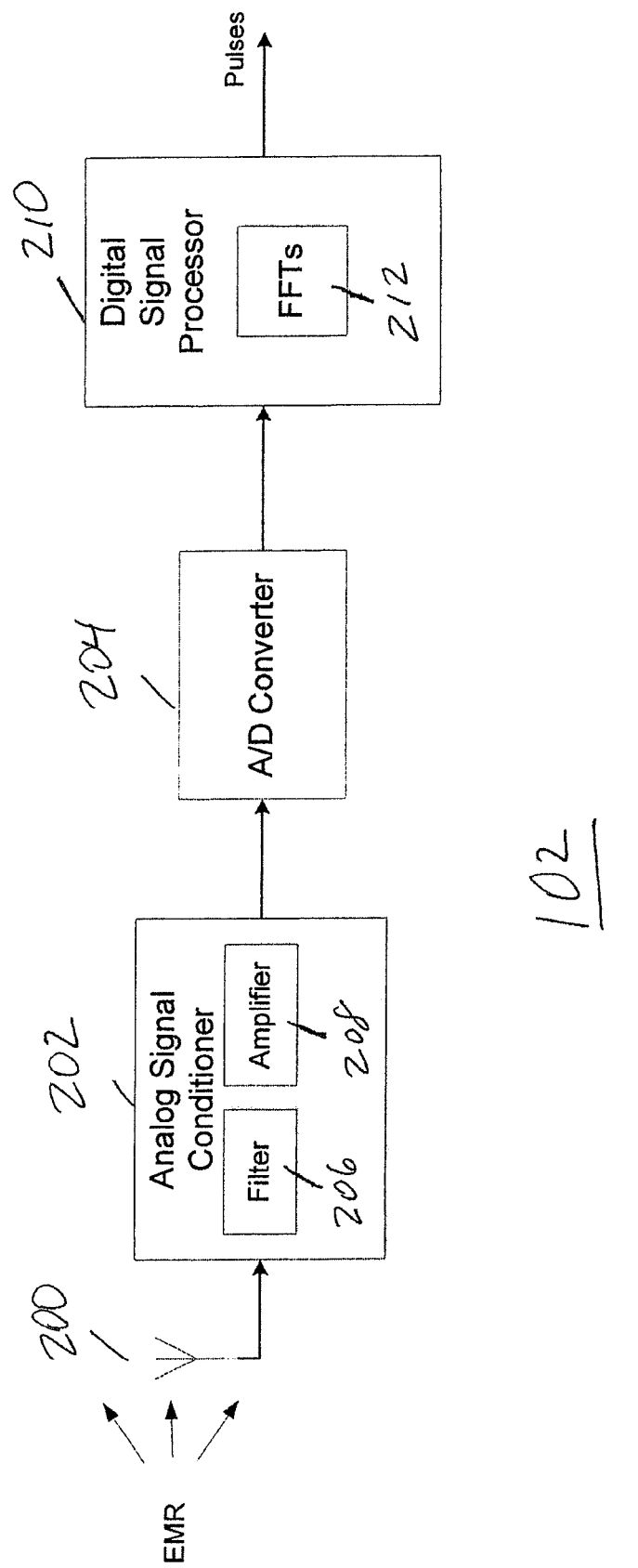
FIG. 2 illustrates an RF receiver in accordance with an exemplary embodiment of the present disclosure.

FIG. 2 illustrates an RF receiver 102 in accordance with an exemplary embodiment of the present disclosure. As shown in FIG. 2, the receiver 102 includes an antenna 200 for receiving EMR emitted from a device, an analog signal conditioner 202 that filters and amplifies the received EMR, and an analog-to-digital (A/D) converter 204. The antenna 200 can include one or more antenna modules, where each module can be tuned to receive EMR of a specified frequency or frequency range. For example, in an exemplary embodiment, the antenna 200 can be tuned to receive any frequency or sub-range of frequencies between 0 and 1.8 GHz.

The analog signal conditioner 202 can include a low-pass filter 206 designed to prevent aliasing in the A/D converter 204 during sampling. The filtered signal can then be amplified in an amplifier 208 by a factor that is determined based on the strength of the received EMR. The factor is determined such that the conditioned signal output from the amplifier 208 fills up a significant portion of the dynamic range of the A/D converter 204 without causing saturation. For example, the factor can be selected at a value that increases the resolution and signal-to-noise ratio of the received EMR prior to entering the A/D converter 204.

The A/D converter 204 can be configured to sample the received EMR at an exemplary rate of 2.8 GHz or any other desired sampling rate, (e.g., at a rate of 3.6 GHz). The sampling rate of the A/D converter 204 generates a stream of digital samples, each stream containing information regarding an operational characteristic of the device that generated the RF emission. The receiver 102 is configured to process the samples through, for example, a digital signal processor 210 (DSP).

The DSP 210 converts the samples to the frequency domain using at least one of a plurality of Fast Fourier Transforms (FFTs) 212. In an exemplary embodiment, the FFTs 212 can be overlapping, where each FFT 212 includes a plurality of frequency bins that are used by the DSP 210 to isolate any number of the samples. Each frequency bin can include a range of frequencies that are isolated by upper and lower bounds. The FFTs 212 are used to select a range of frequency bins within a predetermined sampling interval. Moreover, each FFT 212 can generate 512 samples at an exemplary sampling resolution of at least 2.7 MHz/bin.

In an exemplary embodiment of the present disclosure, the predetermined sampling interval is a multiplicative window, within which spectral energy of a specified frequency range is summed (e.g., integrated). The resulting spectral energy of each interval is compared to the predetermined threshold $T_{SE}$ to determine whether the digital samples (e.g., 512 samples) of a respective FFT contain a pulse of energy. If the spectral energy is above the threshold $T_{SE}$, the samples of the respective FFT contains a pulse and are retained, while those samples having energy that falls below the threshold $T_{SE}$ are discarded. In this manner, the receiver 102 can reduce the amount of data to be analyzed by a factor of, for example, approximately 100,000.

Figure 3:
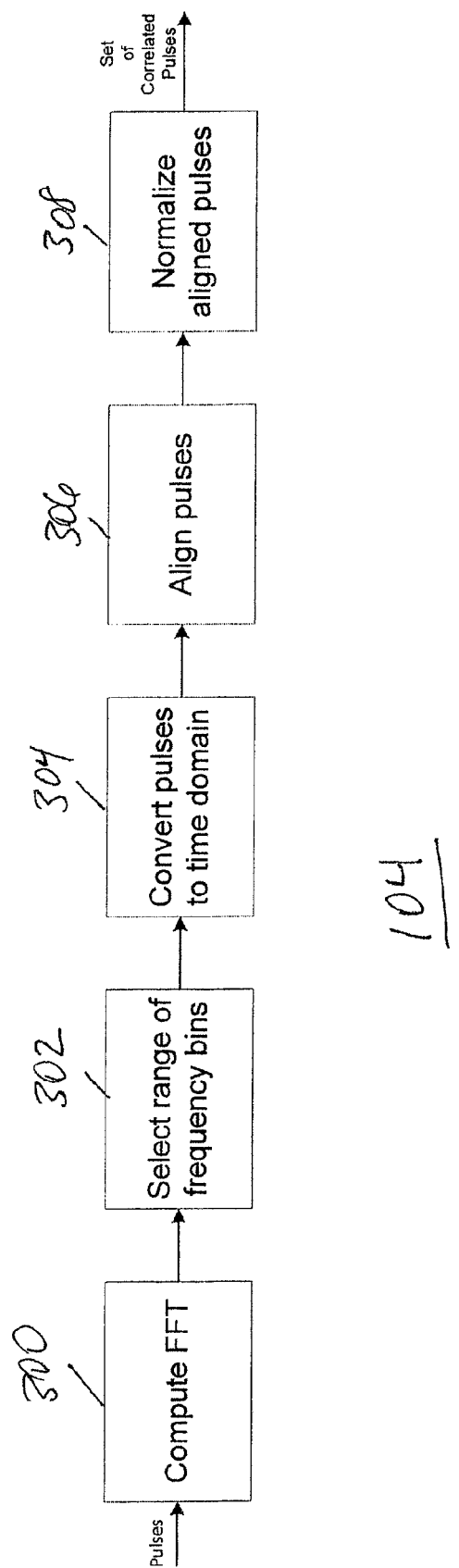
FIG. 3 illustrates a process flow executed by an exemplary signal processor in accordance with an embodiment of the present disclosure.

As shown in FIG. 1, the system 100 also includes a signal processor 104 configured by special programming to condition the series of digital pulses by establishing or arranging the pulses into a set of correlated pulses. FIG. 3 illustrates a processing flow of a signal processor 104 in accordance with an exemplary embodiment of the present disclosure. As shown in FIG. 3, the signal processor 104 is configured to compute an FFT (e.g., sliding FFT) having a plurality of frequency bins for each selected pulse (300) and select a second range of frequency bins using a predetermined interval (e.g., a second multiplicative window) (302).

For example, the signal processor 104 can compute an FFT on each pulse in the set of correlated pulses and apply the second multiplicative window to the spectral (e.g., frequency) bins of each FFT. As a result, the signal processor 104 effectively band pass filters the pulses using the FFT. Following the application of the second multiplicative window, all negative frequency bins are zeroed, such that all frequencies and thus pulses within these bins are discarded.

The signal processor 104 can be configured to convert the pulses associated with the filtered frequency bins from the frequency domain to the time domain using an inverse FFT (IFFT), which generates complex-valued digital pulses (304). The pulses output from the IFFT are aligned by shifting each pulse in time so that its maximum magnitude value corresponds to a predetermined sample index (e.g., 110, for a pulse of length 512) (306). The aligned pulses can then be normalized to have unit energy in that a sum of squared magnitudes of each pulse in the set of correlated pulses is equal to one (308).

Figure 4:
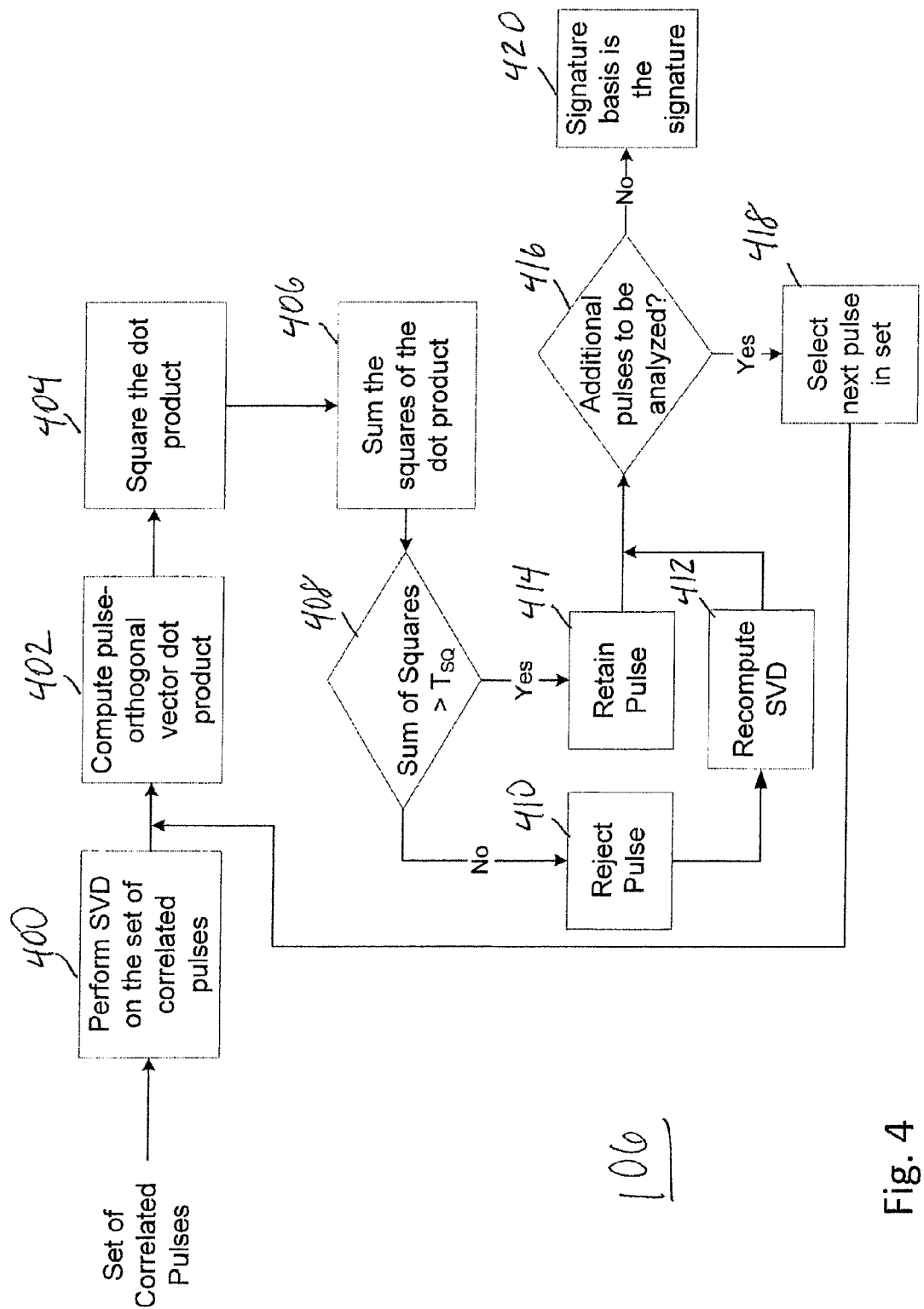
FIG. 4 illustrates a process flow executed by an exemplary signature generator in accordance with the present disclosure.

In FIG. 1, the exemplary system 100 is shown to include a signature generator 106 configured to compute a vector space associated with the set of correlated pulses, compare each pulse in the set of correlated pulses to a basis of the vector space for establishing a device signature, and associate pulses having a threshold percentage of energy within the basis in a database 108 with a device identifier (e.g., signature). FIG. 4 illustrates a process flow executed by the signature generator in accordance with an exemplary embodiment of the present disclosure.

As shown in FIG. 4, the signature generator 106 receives the set of correlated pulses from the signal processor 104 and is configured to perform a Singular Value Decomposition (SVD) on the correlated pulses. As described in Press, William H. et al., "Numerical Recipes in C", 2nd edition, Cambridge University Press, 1992, pp. 59-70, SVD is a known signal processing technique for reducing data by approximating variation among a set of data points.

In accordance with an exemplary embodiment described herein, during SVD the signature generator 106 establishes a vector space V based on the energy of the correlated pulses. For example, the set of correlated pules can be represented by a matrix P composed of pulses ($p_1, p_2, \ldots p_n$). The signature generator 106 computes a set of orthogonal vectors M as the basis for the vector space V (400). As the basis, the set of orthogonal vectors M can span the entire vector space and each vector is linearly independent, such that the pulses can be expressed individually as a linear combination of the set of orthogonal vectors M. In this manner, the set of orthogonal vectors M capture a large percentage or portion of the total spectral energy in the set of correlated pulses.

In an exemplary embodiment, the first ten (10) vectors that correspond to the 10 largest singular values for the set of correlated pulses can be retained as the set of orthogonal vectors M. The vector space defined by the orthogonal vectors establishes the signal subspace for determining the signature (e.g., signature basis). That is, the set of orthogonal vectors M are the same length as the pulse, e.g., 512 samples, and form a ten-dimensional subspace, from which the signature for the set of pulses can be determined.

As represented in Equation 1, the signature generator 106 can be configured to compute a dot product between each pulse in the set of correlated pulses and each orthogonal vector (402), square the result of each dot product (404), and sum the squares of the dot product (406).

$$A = \Sigma_{i=1}^{10} \Sigma_{x=1}^{n} (P_x \cdot M_i)^2 \qquad (1),$$

where n is equal to the total number of pulses in the set of correlated pulses P.

Following these computations, a pulse p in the set of correlated pulses is projected onto the signature basis to determine what fraction of the pulse's energy is contained in the subspace spanned by the signature basis (408). If A is below a predetermined threshold $T_{SQ}$ (e.g., 0.9), then the signature generator 106 rejects the pulse (410). Following rejection of the pulse, the SVD is recomputed on the remaining pulses (e.g., non-rejected pulses) in the set of correlated pulses to establish a new basis (e.g., signature basis) for the vector space (412). On the other hand, if A is greater than the threshold $T_{SQ}$ then the pulse is retained (414). By performing this computation, the signature generator 106 reduces or filters noise from the signature basis.

Following the noise reduction process for any one of the pulses in the set of correlated pulses, the signature generator 106 determines whether any other pulses in the set of correlated pulses are yet to be analyzed (416). If at least one other pulse remains, the signature generator 106 selects the pulse (418) and performs noise reduction with respect to the other pulse as well (402). As such, the signature generator 106 can be configured to iteratively compute a set of orthogonal vectors for each pulse in the set of correlated pulses and perform a noise rejection (e.g., reject a respective pulse based on the sum of squares of the dot product) based on Equation (1) until no further pulses in the set of correlated pulses are rejected. When no further pulses are rejected, the resulting signal subspace basis is determined to be the device signature (420).

As shown in FIG. 1, each signature produced by the signature generator 106 can be stored in a signature database 108. The signature database 108 is a memory device that can be implemented as an integrated storage device or remote storage device accessible over a network connection. In another exemplary embodiment, the signature database 108 can include or be implemented as a hard disk drive, an optical storage device, flash memory, a floppy disk, or other suitable integrated or remote non-volatile storage device as desired.

In an exemplary embodiment, the system 100 can also include a display 110 that is configured to output a visual representation (e.g., waveform) of the received signal during various stages of processing in any one or combination of the RF receiver 102, signal processor 104, and signature generator 106 as desired. The waveforms generated and output by the display 110 can be stored in the signature database 108 or other suitable integrated or remote memory device accessible over a network connection.

When the system 100 generates pulses from EMR of unknown origin, these pulses are projected onto the stored signatures and matched to a device based on the signature having the largest fraction of the new pulse's energy contained therein. For example, via the signature generator 106, the system 100 is configured to compute a dot product between the pulse p and the respective signal subspace vectors $V_S$ of each stored signature S (see Equation 2). The sum of the squares of the dot products is computed to obtain the fraction of the new pulse's energy within the respective subspace.

$$B = \Sigma_{i=1}^{10} (p \cdot V_{S_i})^2 \qquad (2)$$

Once the sum of squares has been computed for each stored signature, the device signature having the largest fraction of the new pulse's energy contained therein identifies the device that produced the new pulse.

FIGS. 5-8 illustrate a method for establishing a signature for a device emitting EMR in accordance with an exemplary embodiment of the present disclosure. The method can be executed by the system 100 having at least an RF receiver 102, a signal processor 104, a signature generator 106, and a signature database 108 as described above and shown in FIG. 1. The system can be placed in an environment in which plural devices are known to generate and/or emit electromagnetic radiation within a specified frequency range.

Figure 5:
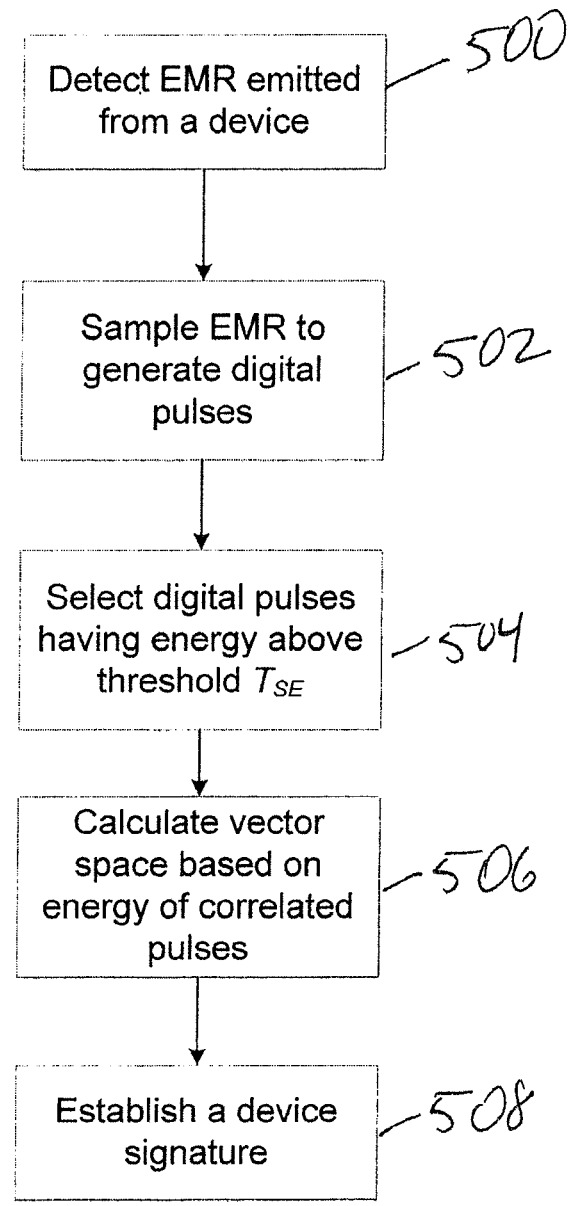
FIGS. 5-8 illustrate a method for establishing a signature for a device emitting EMR in accordance with an exemplary embodiment of the present disclosure.

As shown in FIG. 5, when the system 100 is in this environment, the antenna 200 of the RF receiver 102 is used in receiving EMR emitted from a device (500) in a frequency range specified by the design of the antenna. The RF receiver 102 samples the EMR, via the A/D converter 204, to generate digital pulses having characteristics that are a function of the electromagnetic radiation (502). For example, the digital pulses have an associated spectral energy and magnitude measured from the EMR.

Figure 6:
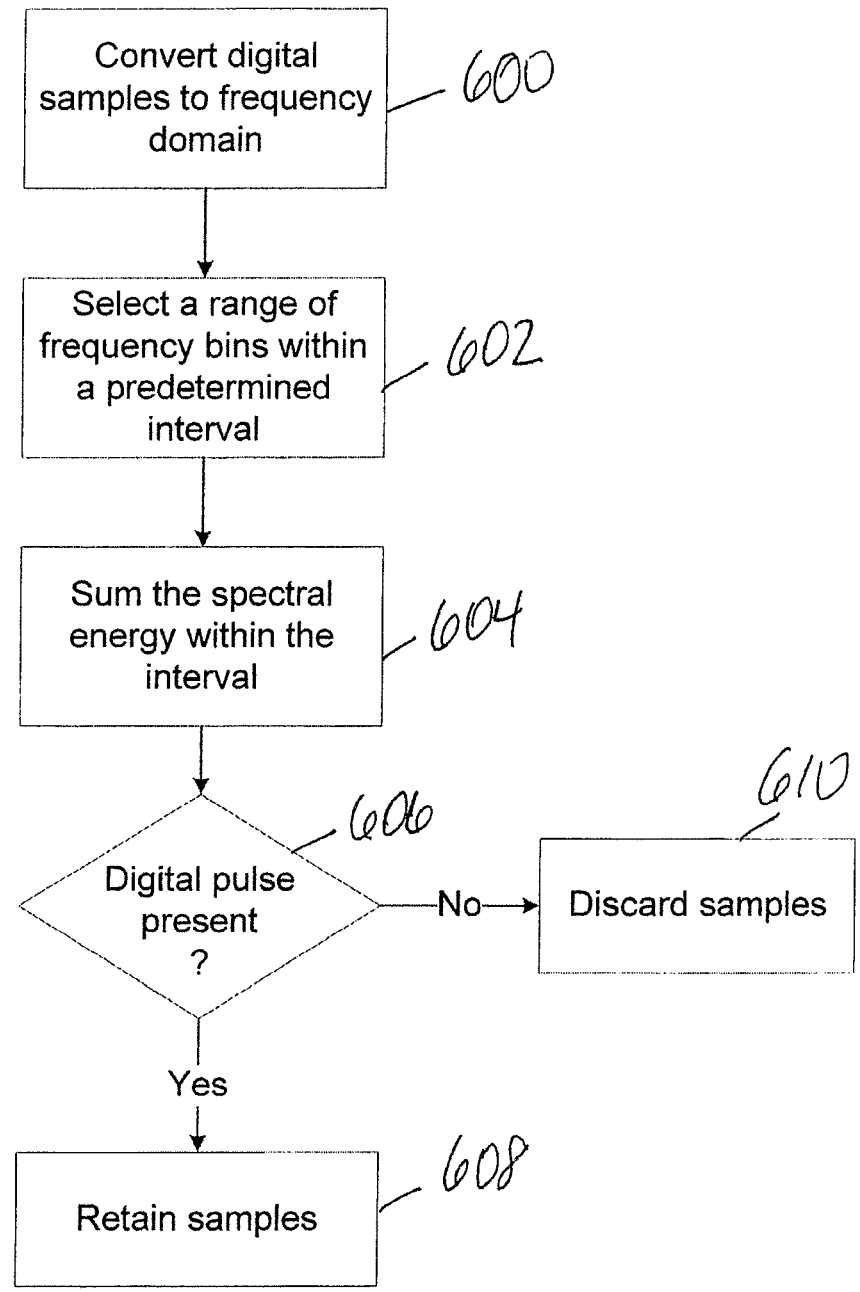

As shown in FIG. 6, the receiver 102 converts the digital pulses to the frequency domain using Fast Fourier Transforms (FFTs) 212 (600). The receiver 102 uses a multiplicative window to select a range of frequency bins within a predetermined interval (e.g., multiplicative window) specified by each FFT (602) and sums the spectral energy of the pulses within the window (604). The receiver 102 determines whether a digital pulse is contained within the window by comparing the sum of the spectral energy to the predetermined threshold $T_{SE}$ (606). If the sum of spectral energy within the window is above the threshold $T_{SE}$, then the window is determined to contain a pulse and a segment of the total samples taken by the respective FFT (e.g., approximately 512 samples) are retained (608). On the other hand, if the sum of spectral energy is not above the threshold $T_{SE}$, then the respective FFT is determined to be void of pulses and the samples are discarded (610).

Figure 7:
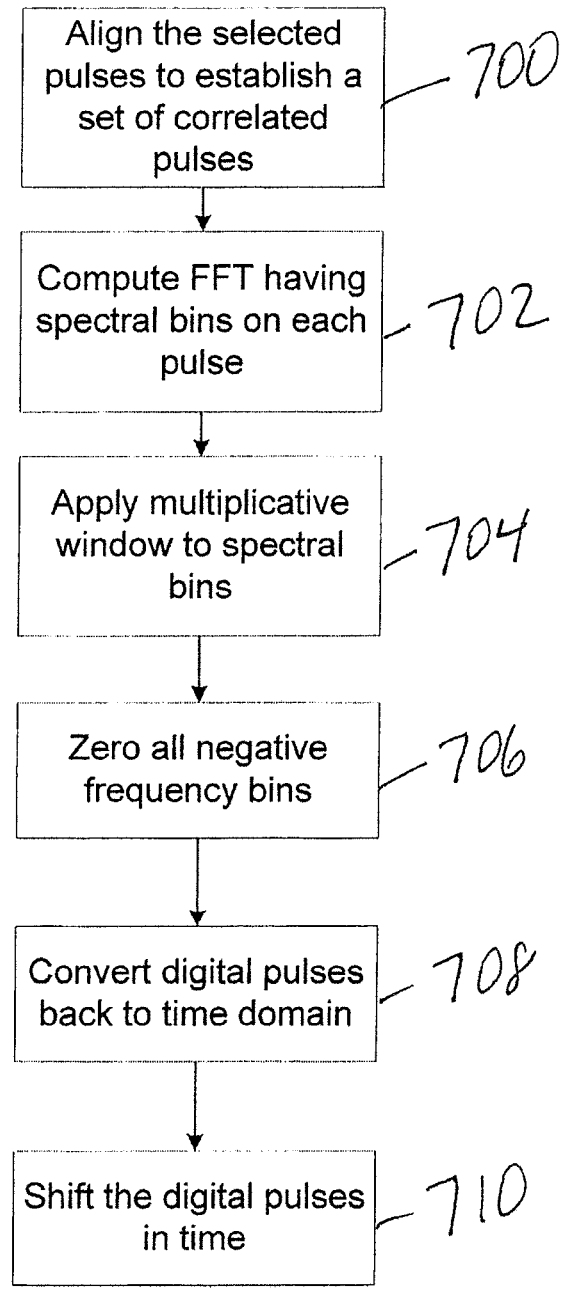

As shown in FIG. 5, the signal processor 104 selects a number of the digital pulses which have energy above the predetermined threshold T as a set of correlated pulses (504). As shown in FIG. 7, in selecting the digital pulses, the signal processor 104 aligns the selected pulses to establish the set of correlated pulses (700). During alignment, the signal processor 104 filters (e.g., band pass filter) the set of correlated pulses by computing an FFT having plural spectral bins on each pulse within the set (702) and applies a multiplicative window (e.g., predetermined interval) to the spectral bins (704). The signal processor 104 also zeroes all negative frequency bins (706). The filtered pulses are converted back to the time domain through an IFFT (708), and are shifted in time so that the maximum magnitude of each pulse falls at a specified sample index (710).

Figure 8:
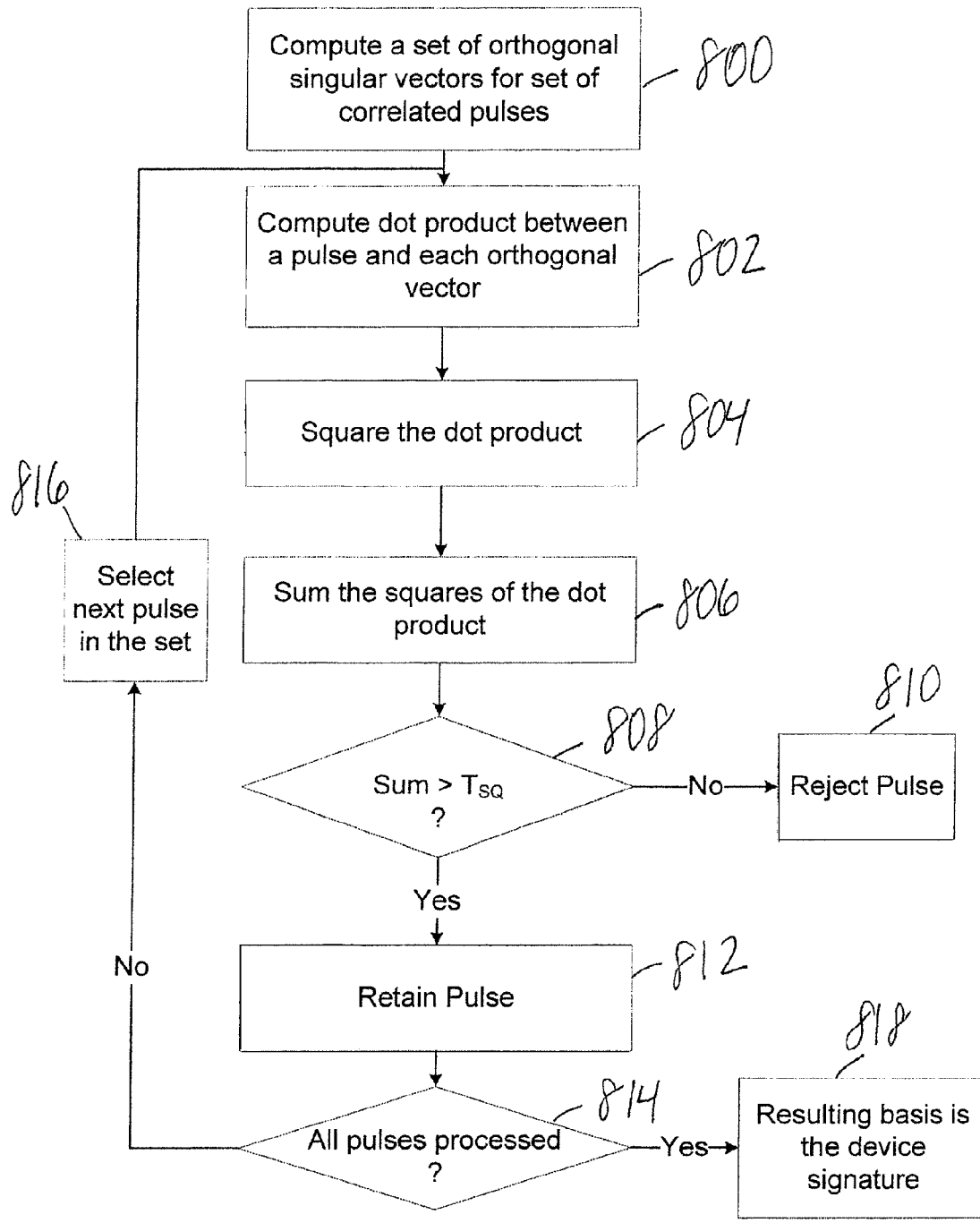

Turning again to FIG. 5, the signature generator 106 calculates a vector space based on the energy of each pulse in the set of correlated pulses (506). As shown in FIG. 8, the signature generator 106 computes a set of orthogonal vectors to establish a vector subspace basis (e.g., signature basis) for the set of pulses (800). To filter and/or reduce noise from the signature basis, for a digital pulse in the set of correlated pulses, a dot product is computed between the respective pulse and each orthogonal vector (802). The resulting dot product is squared (step 804), and the squared dot product is then summed (806). The square of the dot product is compared to the predetermined threshold $T_{SQ}$ (808), e.g. 0.9, and if the resulting value is less than the predetermined threshold $T_S$, the pulse is rejected (810). Otherwise, the pulse is retained (812).

The signature generator 106 establishes a signature of the EMR emitting device by comparing each pulse in the set of correlated pulses to the signature basis of the vector subspace, wherein each pulse in the signature has a threshold percentage of energy within an associated subspace of the vector space basis (508). As shown in FIG. 8, the signature generator 106 determines whether all digital pulses in the set of correlated pulses have been projected upon the signature basis (814). If any pulses have not been projected, then the signature generator 106 selects a next pulse in the set of correlated pulses and returns processing to step 802 (816). On the other hand, if all pulses have been projected then the resulting signature basis is determined to be the signature of the device (818).

Figure 9:
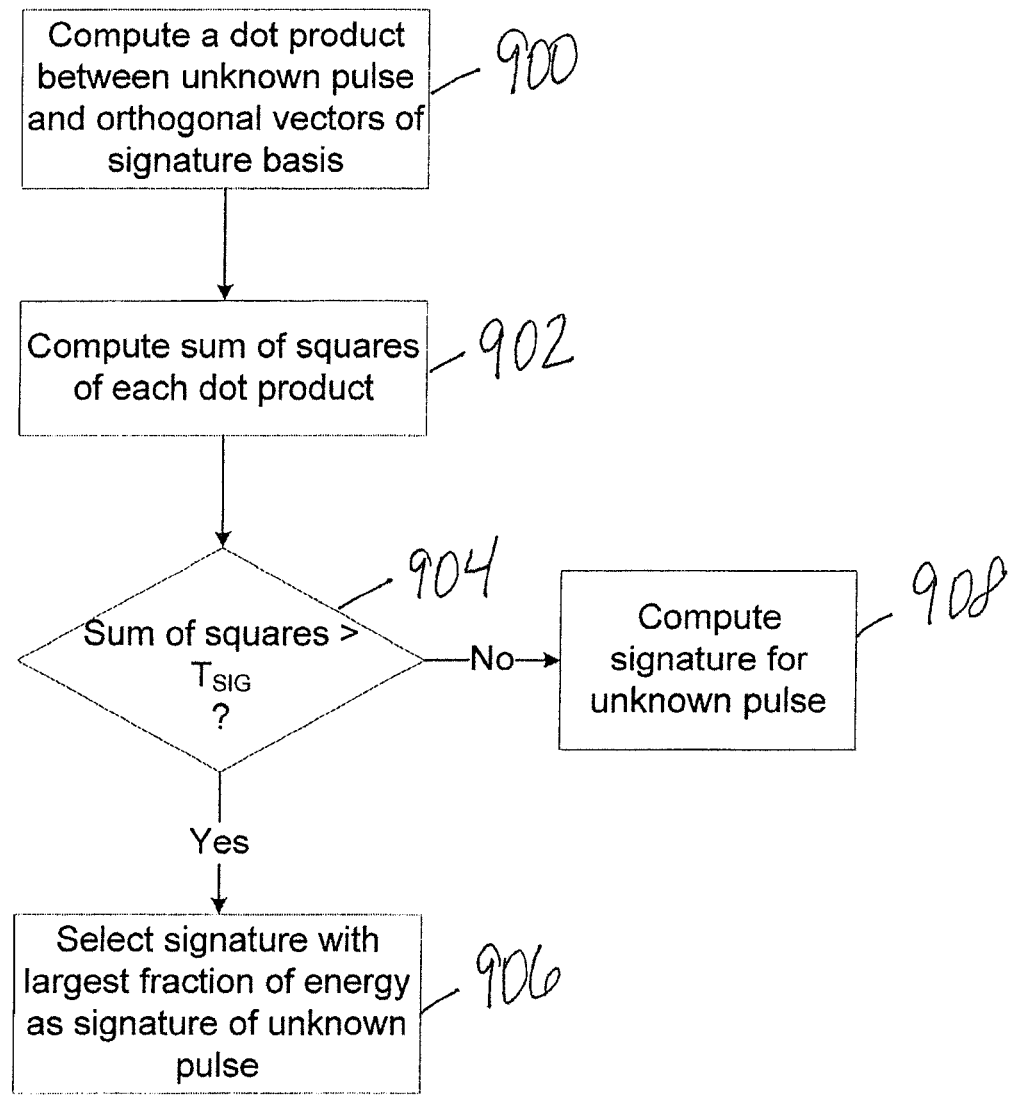
FIG. 9 illustrates a method of classifying an unknown pulse in accordance with an exemplary embodiment of the present disclosure.

FIG. 9 illustrates a method of classifying an unknown pulse in accordance with an exemplary embodiment of the present disclosure.

The device signatures established by the system 100 are stored in memory, such as the signature database 108. When an unknown pulse is detected from a device in the environment being monitored, the system 100 determines whether the unknown pulse can be classified based on the known device identifiers (e.g., signatures) stored in the database 108.

For each signature stored in memory, the signature generator 106 computes a dot product between the unknown pulse and the orthogonal vectors for the respective signature basis (900). The sum of the squares of the dot products is computed to obtain a value that indicates the fraction of the pulse's energy that is contained within the respective vector subspace (902). Each sum of squares result is compared with a predetermined threshold $T_{SIG}$ (904), such that the signature with the largest fraction of energy above the threshold $T_{SIG}$ is chosen as the classification result and identifies the device that generated the pulse (906). On the other hand, if the largest fraction of energy as determined from the comparison is not above the specified threshold $T_{SIG}$, then none of the stored signatures is selected as the classification result, and the system generates a signature for the unknown pulse as described in FIG. 5 (908).

The system 100 can include one or more processors, such as C6000 or C8000 series processors produced by Texas Instruments, or other suitable processing components or circuits, and combinations thereof, suitable for performing the computations and processes described herein. The processor can be coupled to memory or storage devices and configured with programming code to perform and execute the methods performed by the RF receiver 102, the signal processor 104, and the signature generator 106.

The memory can include Random Access Memory (RAM), Read-Only Memory (ROM) or any other suitable memory device or circuit as desired. In an exemplary embodiment, the one or more processors can also be coupled to any number of input/output devices, such as a display, keyboard, mouse, or any other suitable device as desired that provides interfacing capabilities or interaction with a user.

The one or more processors can also be coupled to other processors or memory via a network. The processors can be configured through program code stored in a non-volatile memory device, such as Read-Only Memory (ROM), erasable programmable read-only memory (EPROM), or other suitable memory device or circuit as desired. In an exemplary embodiment, the program code can be recorded on a non-transitory computer readable medium, such as Magnetic Storage Media (e.g. hard disks, floppy discs, or magnetic tape), optical media (e.g., any type of compact disc (CD), or any type of digital video disc (DVD), or other compatible non-volatile memory device as desired.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A system for establishing a signature of a device emitting electromagnetic radiation (EMR), comprising:
    a radio frequency (RF) receiver configured to sample detected EMR, generate pulses having characteristics that are a function of the EMR, and select pulses in a spectral band having energy above a predetermined threshold;
    a signal processor configured to establish a set of correlated pulses by at least aligning the selected pulses by shifting each pulse in time so that its maximum magnitude value corresponds to a predetermined sample index with respect to a predetermined number of pulse samples representative of pulse length, and normalizing the aligned pulses to have unit energy such that a sum of squared magnitude of each pulse in the set of correlated pulses is equal to one; and
    a signature generator configured to compute a vector space associated with the set of correlated pulses, compare each pulse in the set of correlated pulses to a basis of the vector space for the set of correlated pulses for establishing a device signature, and associate pulses having a threshold percentage of energy within the basis in a database with a device identifier.

2. The system of claim 1, wherein the signature generator is configured to identify a device by processing the EMR emitted by the device and to compare the processed EMR to plural device signatures stored in memory, wherein each device signature occupies an associated subspace of said vector space.

3. The system of claim 2, wherein the processed radiation includes at least one pulse of the device, the at least one pulse being correlated to a stored device signature when a total energy of the at least one pulse within the associated subspace is above a predetermined threshold.

4. The system of claim 1, wherein the RF receiver is configured to convert received pulses to a frequency domain using a Fast Fourier Transform (FFT).

5. The system of claim 4, wherein each FFT has a resolution greater than 2.7 MHz/bin.

6. The system of claim 4, wherein each FFT comprises: frequency bins, and the RF receiver is configured to select a range of frequency bins within a predetermined interval.

7. The system of claim 6, wherein the predetermined interval is a window within which spectral energy is summed.

8. The system of claim 6, wherein the signal processor is configured to compute an FFT having plural frequency bins for each selected pulse, and to select a second range of frequency bins using another predetermined interval.

9. The system of claim 8, wherein the signal processor is configured to band pass filter the second range of frequency bins and to zero all negative frequency bins resulting from the filtering.

10. The system of claim 9, wherein the signal processor is configured to convert each pulse associated with a filtered frequency bin from a frequency domain to a time domain.

11. The system of claim 1, wherein the signature generator is configured to compute a first set of orthogonal vectors as the basis of the vector space using the set of correlated pulses.

12. The system of claim 11, wherein the signature generator is configured to:
    compute a dot product between each pulse in the set of correlated pulses and each orthogonal vector;
    square each dot product; and
    sum the squares of the dot products.

13. The system of claim 12, wherein the signature generator is configured to reject a pulse if the sum of squares of the dot products for the pulse is below a predetermined threshold.

14. The system of claim 13, wherein the signature generator is configured to iteratively compute a second set of orthogonal vectors, and reject a pulse based on the sum of squares of the dot products until no further pulses are rejected.

15. The system of claim 13, configured to establish the signature of a device which is a vehicle used on at least one of land, water, and air.

16. A method for establishing a signature for a device emitting electromagnetic radiation (EMR) for identifying the device, comprising:
    detecting EMR emitted from the device;

sampling the EMR to generate pulses having characteristics that are a function of the EMR;
selecting the generated pulses in a spectral band which have energy above a predetermined threshold;
establishing a set a correlated pulses by at least aligning the selected pulses by shifting each pulse in time so that its maximum magnitude value corresponds to a predetermined sample index with respect to a predetermined number of pulse samples representative of pulse length, and normalizing the aligned pulses to have unit energy such that a sum of squared magnitude of each pulse in the set of correlated pulses is equal to one;
calculating a vector space based on the energy of each pulse in the set of correlated pulses; and
establishing a signature of the EMR emitting device by comparing each pulse in the set of correlated pulses to a basis of the vector space for the set of correlated pulses, wherein each pulse in the signature has a threshold percentage of energy within an associated subspace of the vector space basis.

17. The method of claim 16, wherein calculating the vector space includes:
generating a set of orthogonal vectors based on the set of correlated pulses to establish the vector space; and
calculating the basis for the device based on a magnitude of each pulse in the set of correlated pulses.

18. The method of claim 16, comprising:
converting the pulses to a frequency domain using a Fast Fourier Transform (FFT).

19. The method of claim 18, comprising:
selecting a range of frequency bins within a predetermined interval.

20. The method of claim 19, wherein the predetermined interval is a window, the method comprising:
summing spectral energy of the pulses within the window.

21. The method of claim 19, wherein the predetermined interval is a first predetermined interval, the method comprising:
computing an FFT having plural spectral bins on each pulse; and
selecting a second range of spectral bins using a second predetermined interval.

22. The method of claim 21, comprising:
filtering the second range of frequency bins and zeroing all negative frequency bins resulting from the filtering.

23. The method of claim 22, comprising:
converting a filtered pulse from the frequency domain to the time domain.

24. The method of claim 17, wherein establishing the signature of the device includes:
computing a set of orthogonal vectors using the set of correlated pulses to establish a signature basis for the set of pulses.

25. The method of claim 24, comprising:
computing a dot product between each pulse in the set of pulses and each orthogonal vector;
squaring each dot product; and
summing the squares of the dot products.

26. The method of claim 25, comprising:
rejecting a pulse if the sum of squares of the dot products for the pulse is below a predetermined threshold.

27. The method of claim 16, wherein each device signature occupies an associated subspace.

28. The method of claim 27, wherein the device is a known device, the method comprising:
generating at least one pulse from EMR emitted from an unknown device; and
projecting the at least one pulse of the unknown device onto each device signature, wherein the device signature having a largest percentage of total energy of the at least one pulse within the associated subspace is selected as a device classification.

29. The method of claim 28, comprising:
computing a vector space and vector space basis for each device signature; and
calculating a dot product between the at least one pulse of the unknown device and each of the vectors in a respective set of a device signatures to determine a fraction of energy of the at least one pulse of the unknown device in a subspace of the device signature.

* * * * *